(12) United States Patent
Kuno et al.

(10) Patent No.: US 10,490,638 B2
(45) Date of Patent: Nov. 26, 2019

(54) SEMICONDUCTOR DEVICE AND METHOD OF MANUFACTURING THE SAME

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Takashi Kuno, Kariya (JP); Hiroki Tsuma, Okazaki (JP); Satoshi Kuwano, Nagakute (JP); Akitaka Soeno, Toyota (JP); Toshitaka Kanemaru, Gamagoori (JP); Kenta Hashimoto, Aichi-ken (JP); Noriyuki Kakimoto, Obu (JP); Shuji Yoneda, Kariya (JP)

(73) Assignees: TOYOTA JIDOSHA KABUSHIKI KAISHA, Toyota-shi (JP); DENSO CORPORATION, Kariya-shi (JP)

( * ) Notice: Subject to any disclaimer, the term of this patent is extended or adjusted under 35 U.S.C. 154(b) by 0 days.

(21) Appl. No.: 15/878,143

(22) Filed: Jan. 23, 2018

(65) Prior Publication Data

US 2018/0212028 A1   Jul. 26, 2018

(30) Foreign Application Priority Data

Jan. 24, 2017 (JP) .................................. 2017-010627
Dec. 22, 2017 (JP) .................................. 2017-246873

(51) Int. Cl.
*H01L 29/417* (2006.01)
*H01L 23/31* (2006.01)
(Continued)

(52) U.S. Cl.
CPC .. *H01L 29/41708* (2013.01); *H01L 21/28518* (2013.01); *H01L 21/28568* (2013.01); *H01L 23/3171* (2013.01); *H01L 24/05* (2013.01); *H01L 29/45* (2013.01); *H01L 29/66348* (2013.01); *H01L 29/7397* (2013.01); (Continued)

(58) Field of Classification Search
None
See application file for complete search history.

(56) References Cited

U.S. PATENT DOCUMENTS

2016/0254761 A1*   9/2016   Furukawa ............... H01L 25/16
363/131

FOREIGN PATENT DOCUMENTS

JP   2011-249491 A   12/2011

* cited by examiner

*Primary Examiner* — Whitney Moore
(74) *Attorney, Agent, or Firm* — Hunton Andrews Kurth LLP

(57) ABSTRACT

A semiconductor device may include: a semiconductor substrate; a surface electrode covering a surface of the semiconductor substrate; an insulating protection film covering a part of a surface of the surface electrode; and a solder-bonding metal film, the solder-bonding metal film covering a range spreading from a surface of the insulating protection film to the surface of the surface electrode, wherein the surface electrode may include: a first metal film provided on the semiconductor substrate; a second metal film being in contact with a surface of the first metal film, and having tensile strength higher than tensile strength of the first metal film; and a third metal film being in contact with a surface of the second metal film, and having tensile strength which is lower than the tensile strength of the second metal film and is higher than the tensile strength of the first metal film.

12 Claims, 12 Drawing Sheets

(51) Int. Cl.
*H01L 23/00* (2006.01)
*H01L 21/285* (2006.01)
*H01L 29/45* (2006.01)
*H01L 29/66* (2006.01)
*H01L 29/739* (2006.01)
*H01L 23/532* (2006.01)
*H01L 29/06* (2006.01)
*H01L 21/3213* (2006.01)

(52) U.S. Cl.
CPC ........ *H01L 21/32133* (2013.01); *H01L 24/03* (2013.01); *H01L 29/0696* (2013.01); *H01L 2224/05082* (2013.01); *H01L 2224/05155* (2013.01); *H01L 2924/3512* (2013.01)

SEMICONDUCTOR DEVICE AND METHOD OF MANUFACTURING THE SAME

CROSS-REFERENCE TO RELATED APPLICATION

The present application claims priority to Japanese Patent Application Nos. 2017-010627 filed on Jan. 24, 2017 and 2017-246873 filed on Dec. 22, 2017, which are incorporated herein by reference in their entirety.

TECHNICAL FIELD

A technique disclosed herein relates a semiconductor device and a method of manufacturing the same.

BACKGROUND

Japanese Patent Application Publication No. 2011-249491 describes a semiconductor device provided with a surface electrode covering a surface of a semiconductor substrate. This surface electrode includes a lower metal film, a high-strength metal film in contact with a surface of the lower metal film, and an upper metal film in contact with a surface of the high-strength metal film. According to this configuration, damage to the semiconductor substrate caused by wire bonding can be suppressed.

SUMMARY

A semiconductor device including an insulating protection film covering a part of a surface electrode, and a solder-bonding metal film covering a range spreading from a surface of the insulating protection film to a surface of the surface electrode is known. The solder-bonding metal film is a metal film that is to be bonded to an external terminal by solder. Since the solder-bonding metal film covers not only the surface of the surface electrode but also the surface of the insulating protection film, the surface electrode is prevented from partially being exposed when a position of a formation range of the solder-bonding metal film is displaced. In this type of semiconductor devices, high thermal stress is easily generated at a triple-contact portion where the surface electrode, the insulating protection film, and the solder-bonding metal film contact each other, and there is a case where a crack is generated in the surface electrode with a position of the triple-contact portion as a starting point.

The inventor(s) of the present application considered suppressing a crack in a surface electrode by employing the structure of Japanese Patent Application Publication No. 2011-249491 as the surface electrode of this type of semiconductor devices. However, even with the employment of the structure of Japanese Patent Application Publication No. 2011-249491, there still is a case where a crack is generated in an upper metal film with the triple-contact portion as the starting point. When such a crack occurs, it is difficult to stop the crack from spreading by a high-strength metal film. With respect to this, it may be conceivable that strength of the surface electrode as a whole is enhanced, however, in such a case, high thermal stress would be generated between the surface electrode and the semiconductor substrate, and stress applied to the semiconductor substrate is thereby increased.

Thus, the disclosure herein provides a technique that suppresses a crack from occurring in a surface electrode, and lessens stress applied to a semiconductor substrate.

A semiconductor device disclosed herein may comprise a semiconductor substrate, a surface electrode covering a surface of the semiconductor substrate, an insulating protection film covering a part of a surface of the surface electrode, and a solder-bonding metal film covering a range spreading from a surface of the insulating protection film to the surface of the surface electrode. The surface electrode may comprise a first metal film provided on the semiconductor substrate, a second metal film being in contact with a surface of the first metal film and having tensile strength higher than tensile strength of the first metal film, and a third metal film being in contact with a surface of the second metal film and having tensile strength which is lower than the tensile strength of the second metal film and is higher than the tensile strength of the first metal film.

In this semiconductor device, the second metal film of the surface electrode has the high tensile strength. Further, the first metal film having the small tensile strength is provided on a semiconductor substrate side with respect to the second metal film. The first metal film having the small tensile strength can deform flexibly according to stress. Due to this, high thermal stress is suppressed from being generated between the surface electrode and the semiconductor substrate, and stress applied to the semiconductor substrate can be lessened. Further, in this semiconductor device, the third metal film is provided on a surface side with respect to the second metal film (on a side closer to the insulating protection film and the solder-bonding metal film). Although the tensile strength of the third metal film is lower than that of the second metal film, it is higher than that of the first metal film. Due to this, even if high thermal stress is generated at the triple contact portion, a crack is less likely to occur in the third metal film. As such, the surface electrode is more durable against crack generation.

DETAILED DESCRIPTION

First Embodiment

Figure 1:
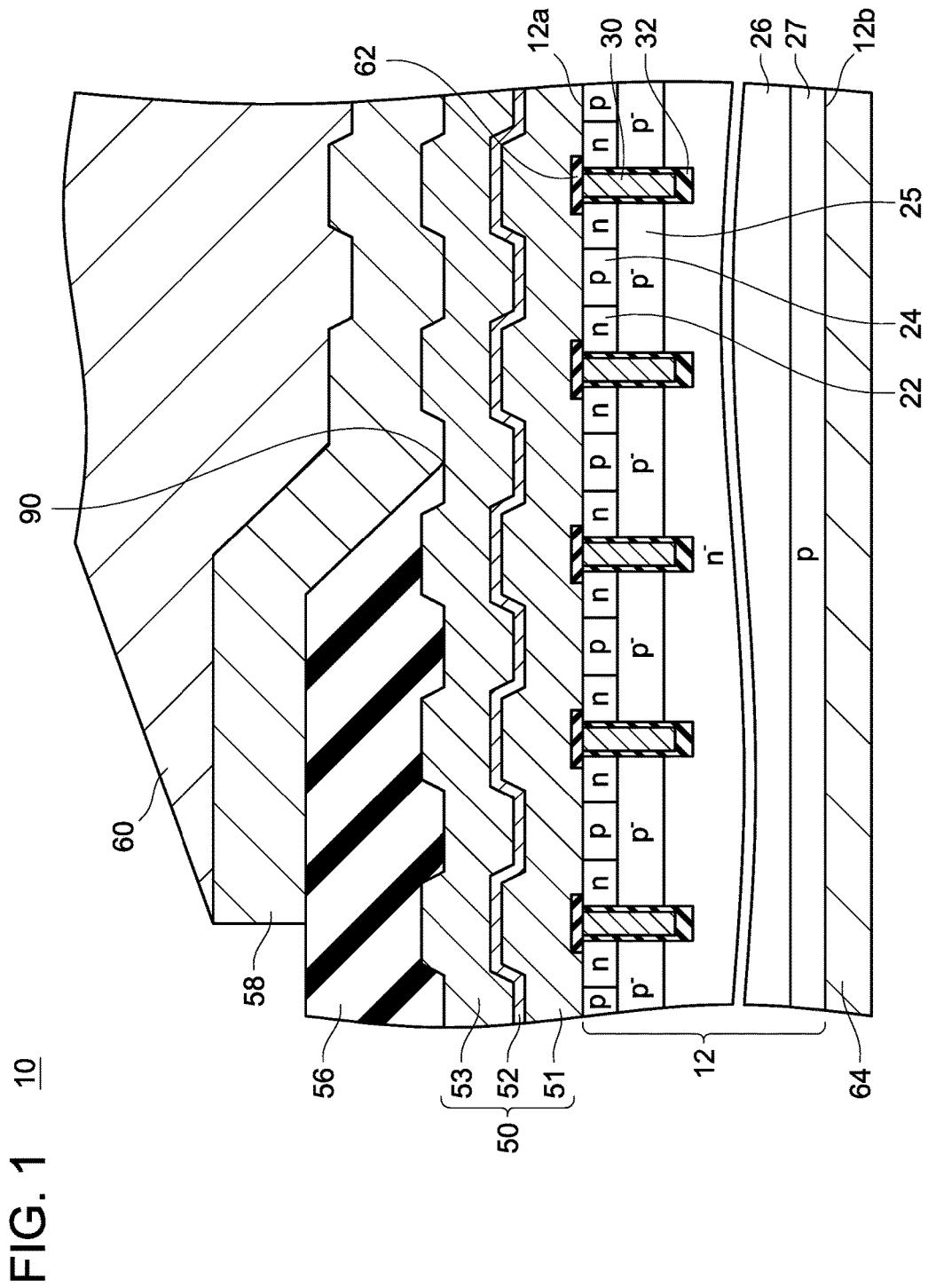
FIG. 1 is a cross-sectional view of a semiconductor device of a first embodiment.

A semiconductor device 10 of a first embodiment shown in FIG. 1 includes a semiconductor substrate 12. An upper surface 12a of the semiconductor substrate 12 is provided with trenches. Each trench is provided therewithin with a gate electrode 30 and a gate insulating film 32. An upper surface of each gate electrode 30 is covered by an interlayer insulating film 62. N-type emitter regions 22, a p-type body contact region 24, a p-type body region 25, an n-type drift region 26, and a p-type collector region 27 are provided within the semiconductor substrate 12. A surface electrode 50 is arranged on the upper surface 12a of the semiconductor substrate 12. A lower electrode 64 is arranged on a lower surface 12b of the semiconductor substrate 12. An IGBT (Insulated Gate Bipolar Transistor) is configured by the emitter regions 22, the body contact regions 24, the body region 25, the drift region 26, the collector region 27, the gate electrodes 30, and the like. The surface electrode 50 functions as an emitter electrode of the IGBT. The lower electrode 64 functions as a collector electrode of the IGBT.

The surface electrode 50 includes a first metal film 51, a second metal 52, and a third metal film 53.

The first metal film 51 is arranged on the upper surface 12a of the semiconductor substrate 12. The first metal film 51 is insulated from the gate electrodes 30 by the interlayer insulating films 62. The first metal film 51 is in contact with the upper surface 12a of the semiconductor substrate 12 in a range where the interlayer insulating films 62 do not exist. The first metal film 51 is a metal film including AlSi (alloy of aluminum and silicon) as its main material. The first metal film 51 makes ohmic contact with the emitter regions 22 and the body contact region 24.

The second metal film 52 is in contact with a surface of the first metal film 51. The second metal film 52 covers an entirety of the surface of the first metal film 51. The second metal film 52 is a metal film including Ti (titanium) or TiN (titanium nitride) as its main material. Tensile strength of the second metal film 52 is higher than tensile strength of the first metal film 51.

The third metal film 53 is in contact with a surface of the second metal film 52. The third metal film 53 covers an entirety of the surface of the second metal film 52. The third metal film 53 is a metal film including AlSi as its main material. A crystal grain size of AlSi of the third metal film 53 is smaller than a crystal gain size of AlSi of the first metal film 51. In general, strength of a metal becomes higher with a smaller crystal grain size. Due to this, tensile strength of the third metal film 53 is higher than the tensile strength of the first metal film 51.

A peripheral portion of a surface of the surface electrode 50 is covered by an insulating protection film 56. The insulating protection film 56 is constituted of polyimide. The insulating protection film 56 is in contact with the surface electrode 50 (that is, the third metal film 53). A center portion of the surface of the surface electrode 50 is not covered by the insulating protection film 56.

A range spreading from a surface of the insulating protection film 56 to the surface of the surface electrode 50 is covered by a solder-bonding metal film 58. The solder-bonding metal film 58 is constituted of metal having solder wettability. In this embodiment, the solder-bonding metal film 58 is a metal film including nickel as its main component. The solder bonding metal film 58 covers an entirety of the surface of the surface electrode 50 in a range that is not covered by the insulating protection film 56. A surface of the solder-bonding metal film 58 is covered by a solder layer 60. The solder-bonding metal film 58 is connected to a terminal that is not shown by the solder layer 60.

As aforementioned, the solder-bonding metal film 58 is in contact with the insulating protection film 56 and the surface electrode 50. Especially at an end of the insulating protection film 56, the solder-bonding metal film 58, the insulating protection film 56, and the surface electrode 50 (that is, the third metal film 53) are in contact with each other. Hereinbelow, a portion where they are in contact with each other will be termed a triple contact portion 90.

The semiconductor substrate 12 repeatedly generates heat during an operation of the semiconductor device 10. Due to this a temperature of the entire semiconductor device 10 changes repeatedly. Since linear expansion coefficients of the respective materials constituting the semiconductor device 10 differ from each other, expansion rates of the respective materials differ upon the temperature change. Due to this, thermal stress is generated inside the semiconductor device 10. Especially at the triple contact portion 90, high thermal stress is generated since the three materials having different linear expansion coefficients are in contact with each other. If a conventional structure (structure constituted of a single layer metal film with AlSi as its main component) is employed as the surface electrode 50, a crack may easily be generated in the surface electrode 50 due to repeated application of high thermal stress to its triple contact portion 90. Contrary to this, in the semiconductor device 10 of the first embodiment, a crack in the surface electrode 50 is suppressed by the second metal film 52 and the third metal film 53. That is, in the semiconductor device 10 of the first embodiment, the surface electrode 50 includes the second metal film 52 having the high tensile strength as an intermediate layer. The second metal film 52 strengthens the entire surface electrode 50. Further, the crystal grain size in the third metal film 53, which is the topmost layer of the surface electrode 50, is small, by which the tensile strength of the third metal film 53 is increased. Due to this, even if high thermal stress is repeatedly generated at the triple contact portion 90, the third metal film 53 is more durable against cracks. Further, even if a crack is generated in the third metal film 53, the crack does not easily grow larger due to the small crystal grain size of the third metal film 53. Due to this, according to the semiconductor device 10, a characteristic deterioration caused by a crack in the surface electrode 50 can be suppressed.

Figure 2:
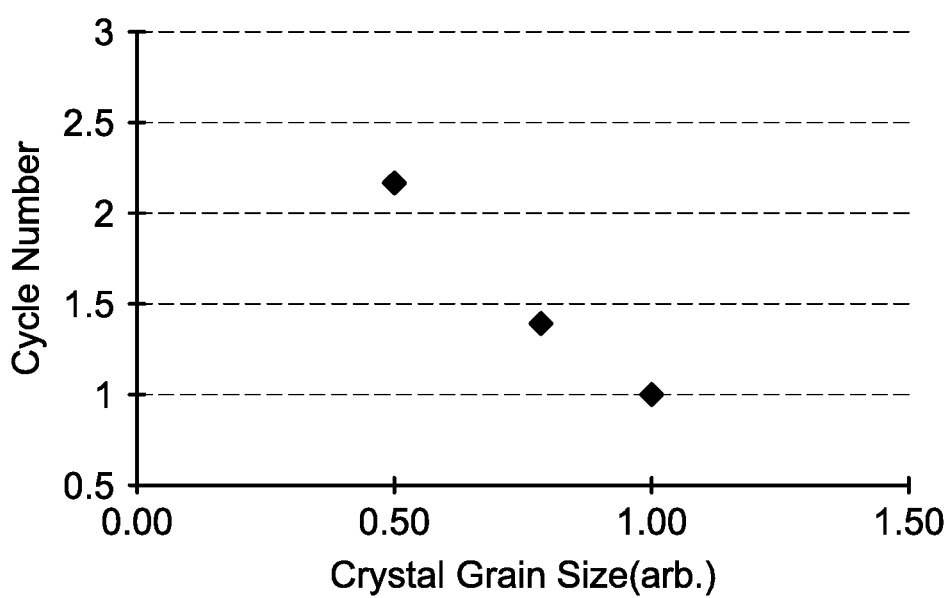
FIG. 2 is a graph showing a relationship between a crystal grain size and durability.

It should be noted that FIG. 2 shows results of a heat cycle test carried out on third metal films 53 having different crystal grain sizes. A vertical axis in FIG. 2 shows a number of heat cycles that had been reached by the time when the characteristic deterioration caused by a crack occurred. As shown in FIG. 2, it can be understood that a durability against cracks is greater for the third metal films 53 having smaller crystal grain size.

Further, when the temperature of the semiconductor device 10 changes, thermal stress is generated also at an interface between the surface electrode 50 and the semiconductor substrate 12. However, in this embodiment, the portion of the surface electrode 50 making contact with the semiconductor substrate 12 is constituted of the first metal film 51 having the small tensile strength. Flexibility of the first metal film 51 allows the thermal stress at the interface between the surface electrode 50 and the semiconductor substrate 12 to be alleviated. Accordingly, stress applied to the semiconductor substrate 12 is reduced.

As described above, according to the semiconductor device 10, a crack in the surface electrode 50 can be suppressed, and the thermal stress applied from the surface electrode 50 to the semiconductor substrate 12 can be reduced.

Figure 3:
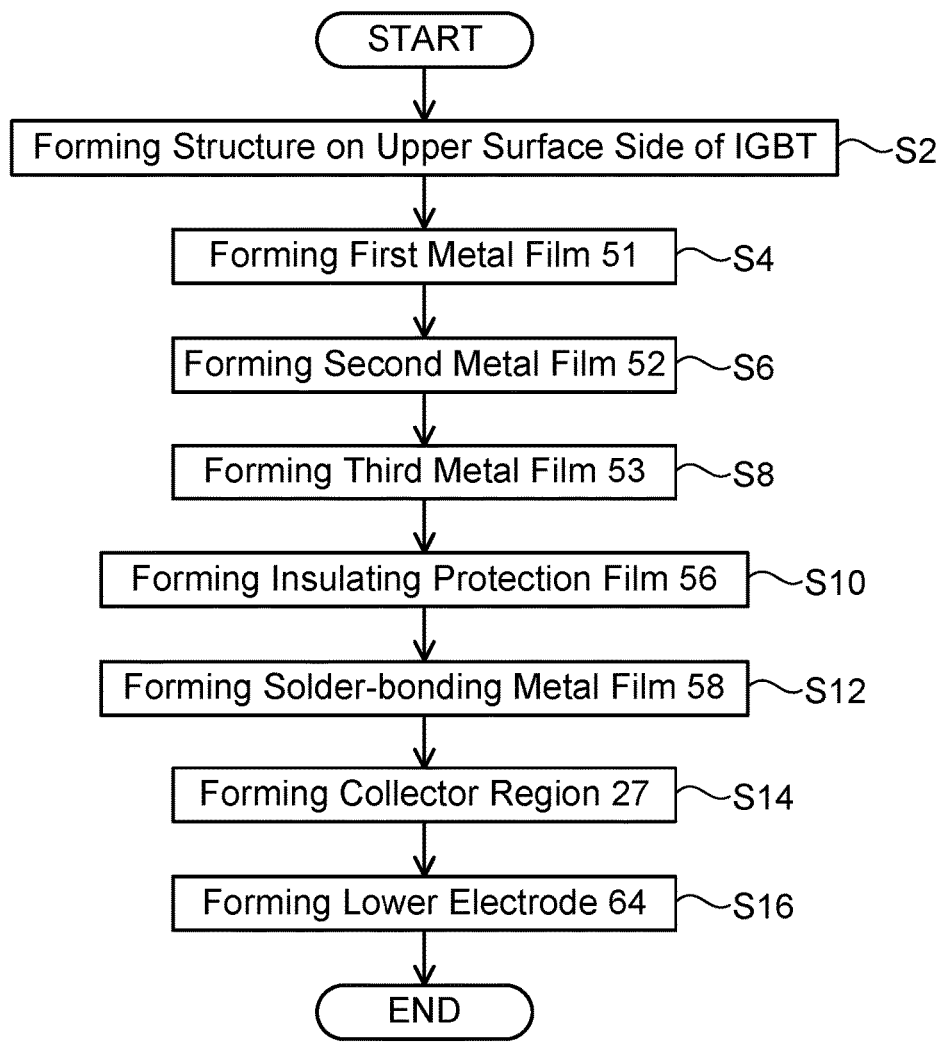
FIG. 3 is a flowchart showing a method of manufacturing the semiconductor device of the first embodiment.
Figure 4:
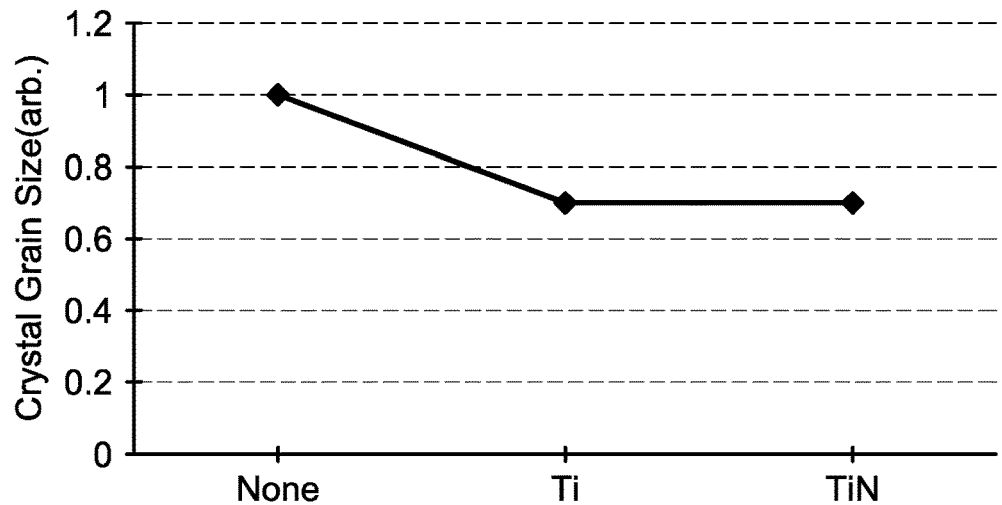
FIG. 4 is a graph showing a relationship between a material of a second metal film and a crystal grain size of a third metal film.
Figure 5:
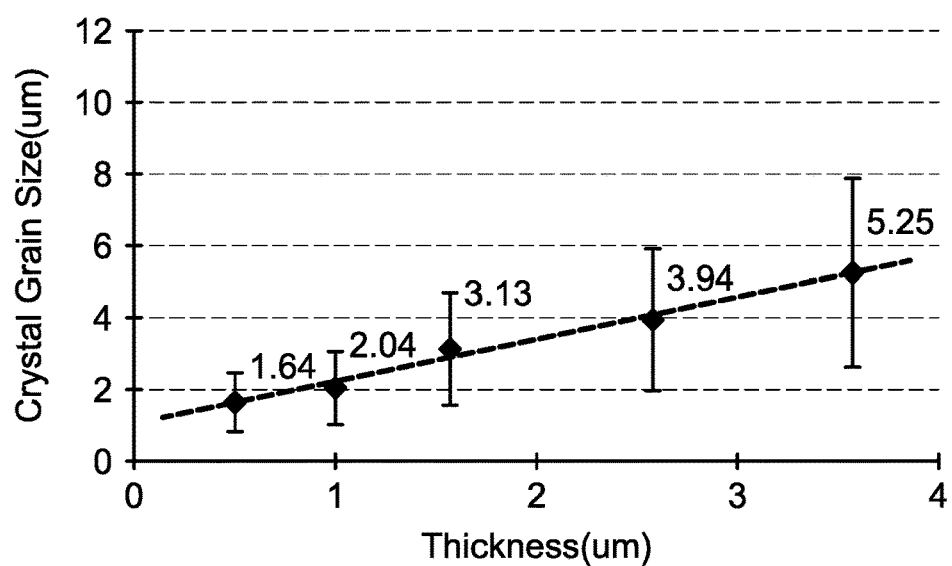
FIG. 5 is a graph showing a relationship between a thickness of the third metal film and the crystal grain size of the third metal film.

Next, a manufacturing method of the semiconductor device 10 will be described. FIG. 3 is a flow chart showing the manufacturing method of the semiconductor device 10, in step S2, a structure on an upper surface side of the IGBT (the gate electrodes 30, the gate insulating films 32, the interlayer insulating films 62, the emitter regions 22, the body contact region 24, and the body region 25) is formed by conventionally known methods. Next, in step S4, the first metal film 51 is formed by growing a metal film including AlSi as its main component on the semiconductor substrate 12. Next, in step S6, the second metal film 52 is formed by growing a metal film including Ti or TiN as its main component on the first metal film 51. Next, in step S8, the third metal film 53 is formed by growing a metal film including AlSi as its main component on the second metal film 52. The surface electrode 50 is thereby completed. When the third metal film 53 (that is, the metal film including AlSi as its main component) is grown, the crystal grain size in the third metal film 53 changes depending on a material of its base layer. FIG. 4 shows a relationship between the material of the second metal film 52 (horizontal axis) and the crystal grain size of the third metal film 53 (vertical axis) upon growing the third metal film 53. "None" in FIG. 4 indicates a case where the metal film including AlSi as its main component is grown on the semiconductor substrate 12 without providing the second metal film 52. As shown in FIG. 4, by using Ti or TIN as the main component of the second metal film 52, the crystal grain size of the third metal film 53 to be grown on an upper portion thereof can be made smaller. Further, FIG. 5 shows a relationship between a thickness of the third metal film 53 (horizontal axis) and the crystal grain size thereof (vertical axis) when the main component of the second metal film 52 is TiN. As shown in FIG. 5, the crystal grain size of the third metal film 53 becomes smaller when the thickness of the third metal film 53 is thinner. As above, according to this method, the crystal grain size of the third metal film 53 can be adjusted, and the crystal grain size of the third metal film 53 can be made smaller than the crystal grain size of the first metal film 51. As aforementioned, the metal strength is increased with smaller crystal grain sizes. Thus, according to this method, the third metal film 53 having the higher tensile strength than the first metal film 51 can be formed. Although the thickness of the third metal film 53 is preferably thinner to make its crystal grain size smaller, the third metal film 53 preferably has a certain degree of thickness in order to be able to withstand stress. Thus, the thickness of the third metal film 53 is preferably 1 to 4 μm. A thickness of the second metal film 52 is preferably set at between 30 to 500 nm by taking coverage of surface level differences into consideration. A thickness of the first metal film 51 is preferably set at between 1 to 4 μm to be able to cover the interlayer insulating films 62.

When the surface electrode 50 is completed, the insulating protection film 56 is formed in step S10 to cover the peripheral portion of the surface electrode 50. Next, in step S12, the solder-bonding metal film 58 is formed to cover the range spreading from the surface of the insulating protection film 56 to the surface of the surface electrode 50. Then, in step S14, the collector region 27 is formed in the semiconductor substrate 12. Next, in step S16, the lower electrode 64 is formed on the lower surface 12b of the semiconductor substrate 12. The semiconductor device 10 is completed by the foregoing steps. After this, when the semiconductor device 10 is to be mounted, the solder-bonding metal film 58 is connected to the external terminal by the solder layer 60.

Second Embodiment

Figure 6:
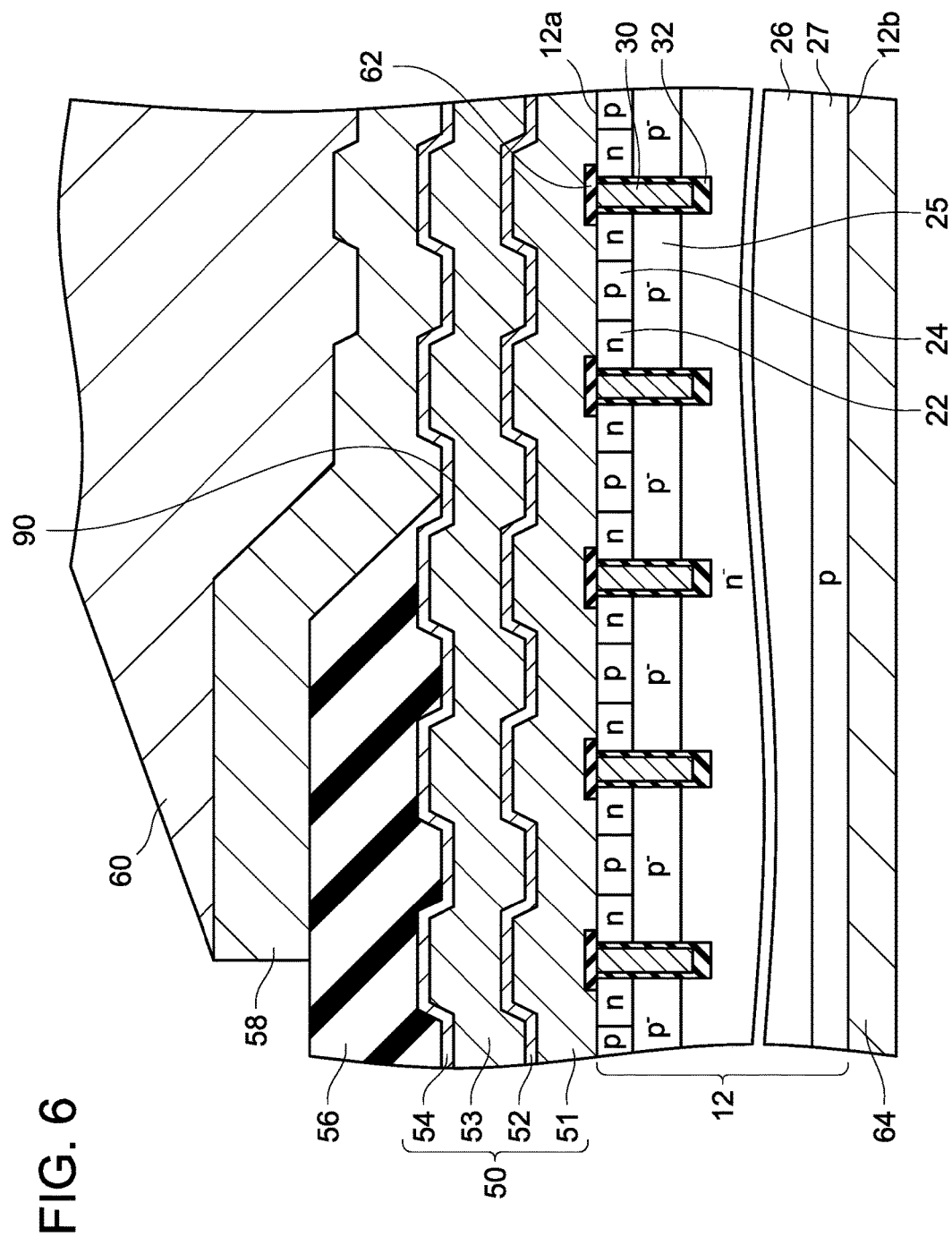
FIG. 6 is a cross-sectional view of a semiconductor device of a second embodiment.

In the aforementioned first embodiment, the topmost layer of the surface electrode 50 was constituted of the third metal film 53. In a second embodiment, as shown in FIG. 6, the surface electrode 50 includes a fourth metal film 54 covering a surface of the third metal film 53. The fourth metal film 54 is a metal film having tensile strength at about the same degree as the tensile strength of the second metal film 52, and is a metal film including, for example, Ti or TiN as its main material. The fourth metal film 54 is in contact with the insulating protection film 56 and the solder-bonding metal film 58. According to this configuration, the fourth metal film 54 having the high tensile strength suppresses a crack in the surface electrode 50 more efficiently.

Third Embodiment

Figure 7:
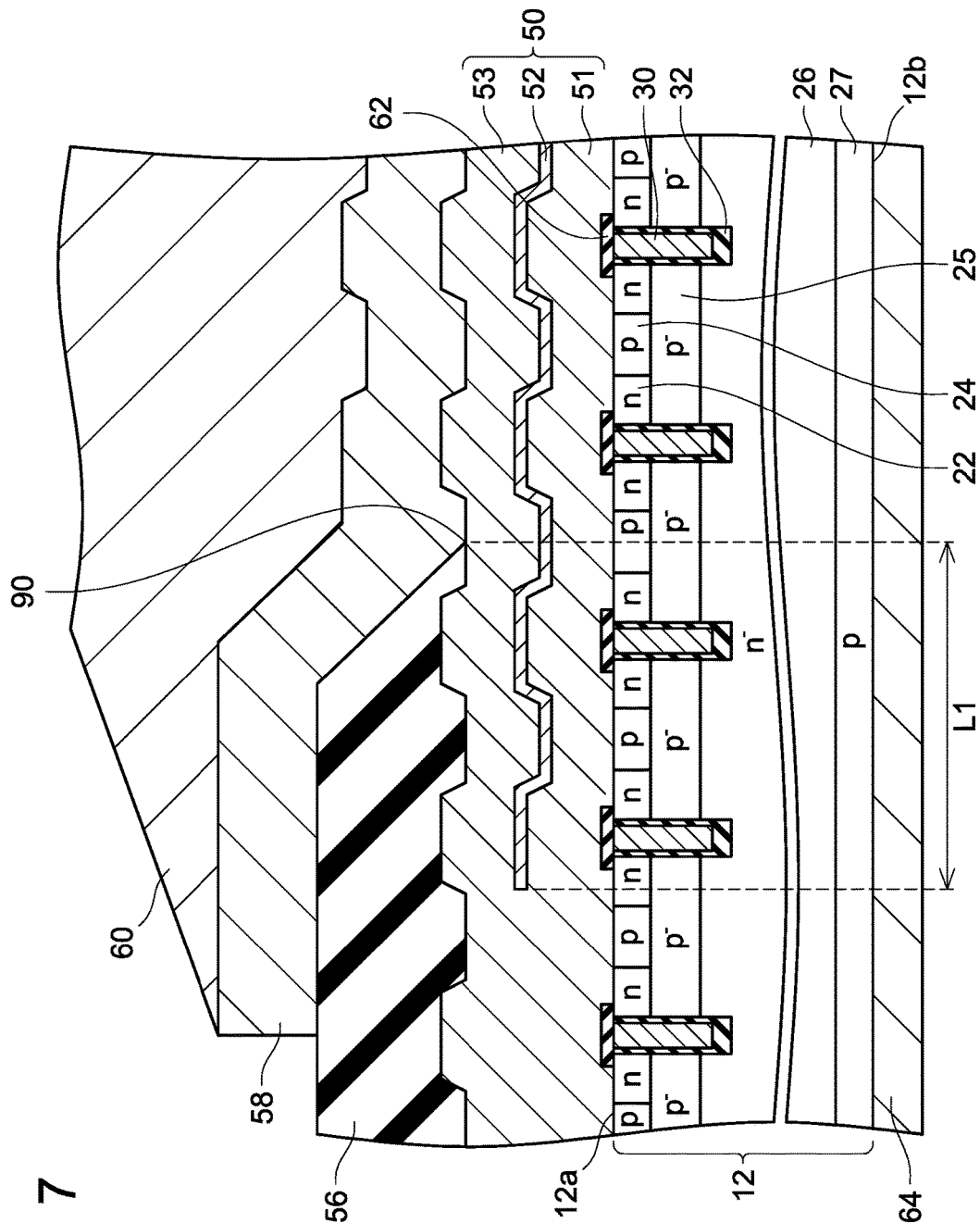
FIG. 7 is a cross-sectional view of a semiconductor device of a third embodiment.

In the aforementioned first embodiment, the second metal film 52 was provided over an entire region of the surface electrode 50 in a lateral direction. In a third embodiment, as shown in FIG. 7, the second metal film 52 is not provided at a part of the peripheral portion of the surface electrode 50 (portion under the insulating protection film 56). As above, the second metal film 52 may be omitted at a portion where high stress is rarely applied. Thermal stress generated with the triple contact portion 90 as a source point acts within a range of about 30 μm from the triple contact portion 90, and it strongly acts especially within a range of about 20 μm from the triple contact portion 90. Accordingly, it is preferable to set a distance L1 between the portion where the second metal film 52 does not exist and the triple contact portion 90 to be equal to or more than 20 μm, and it is more preferable to set the distance L1 to be equal to or more than 30 μm.

Fourth Embodiment

Figure 8:
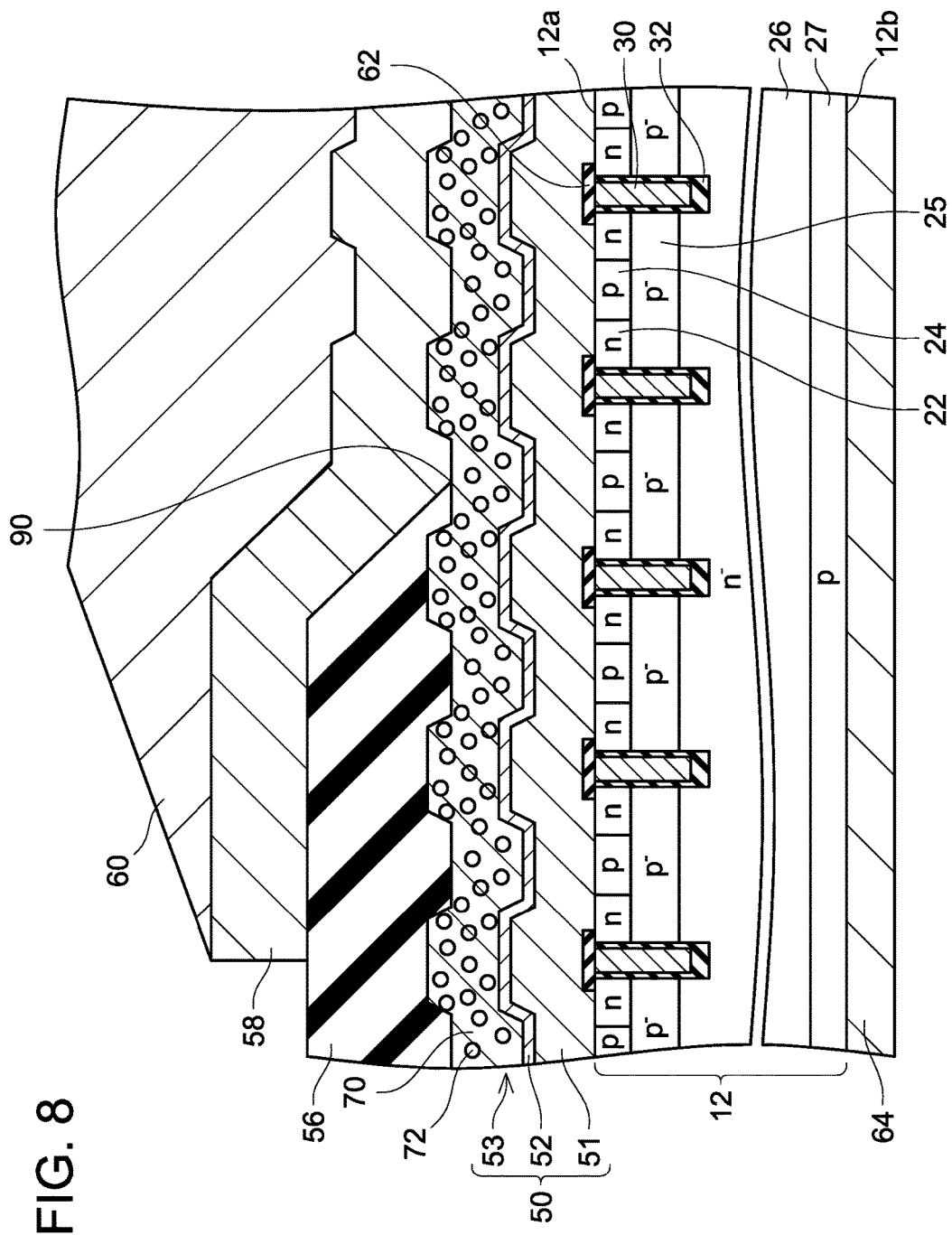
FIG. 8 is a cross-sectional view of a semiconductor device of a fourth embodiment.

In a fourth embodiment, as shown in FIG. 8, the third metal film 53 includes a main metal layer 70 and metal particles 72 dispersed in the main metal layer 70. The main metal layer 70 is constituted of metal including AlSi as its main component. The metal particles 72 are constituted of metal including Cu (copper) as the main component. Tensile strength of the metal particles 72 is higher than tensile strength of the main metal layer 70. Further, resistivity of the metal particles 72 is lower than resistivity of the main metal layer 70. The metal particles 72 preferably exist within the third metal film 53 at a distribution ratio equal to or more than 0.5 wt %.

When the metal particles 72 are dispersed within the main metal layer 70, a crystal grain size of AlSi in the main metal layer 70 becomes small. Due to this, the tensile strength of the third metal film 53 increases. Further, since the tensile strength of the metal particles 72 is high, the tensile strength of the third metal film 53 also becomes high due to this factor as well. Thus, according to the configuration of the fourth embodiment, the tensile strength of the third metal film 53 can further be increased, and a crack in the surface electrode 50 can be suppressed more effectively.

Further, when the crystal grain size of AlSi (that is, the main metal layer 70) becomes small, resistivity of AlSi becomes high. However, in the fourth embodiment, the resistivity of the metal particles 72 is low, and as such, resistance of the third metal film 53 does not increase so much even if the resistivity of the main metal layer 70 becomes high. That is, according to this configuration, an increase in the resistance of the third metal film 53 due to the size reduction of the crystal grains can be suppressed.

A manufacturing method of the semiconductor device of the fourth embodiment differs from the manufacturing method of the first embodiment regarding step S8, and other steps are same as those of the manufacturing method of the first embodiment. In step S8 of the fourth embodiment, the third metal film 53 is grown on the second metal film 52 while the metal particles 72 are dispersed in the main metal layer 70. When the third metal film 53 is grown as above, the crystal grain size of the main metal layer 70 becomes small. As such, the tensile strength of the third metal film 53 can be increased. Further, the second metal film 52 prevents the metal particles 72 from dispersing to the first metal film 51 and the semiconductor substrate 12 upon growing the third metal film 53.

Fifth Embodiment

Figure 9:
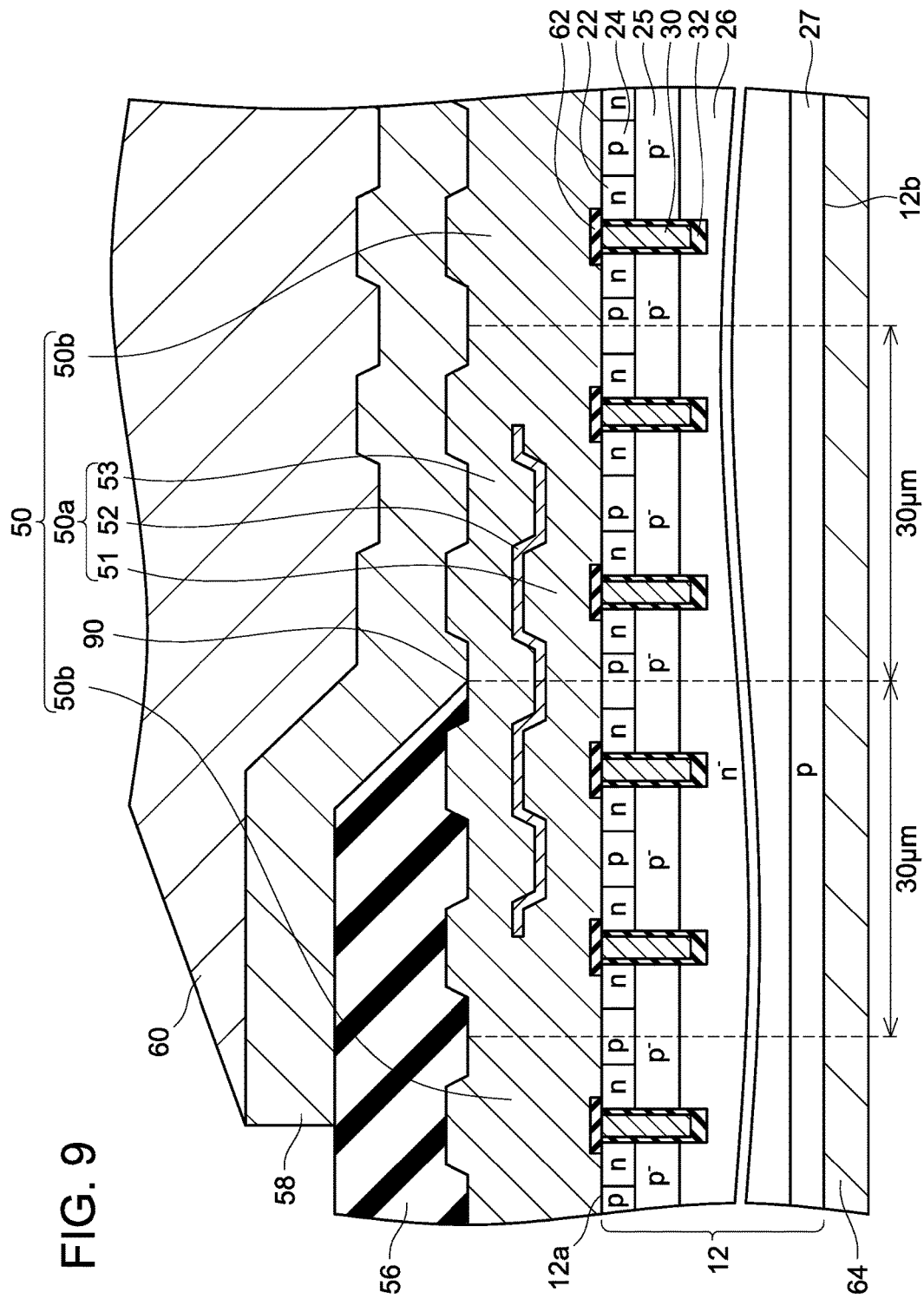
FIG. 9 is a cross-sectional view of a semiconductor device of a fifth embodiment.

In the aforementioned first embodiment, the second metal film 52 was provided over an entire region of the surface electrode 50 in a lateral direction. Contrary to this, in a fifth embodiment, the second metal film 52 is provided only under the triple contact portion 90, as shown in FIG. 9. That is, in a plan view of the upper surface 12a along a thickness direction of the semiconductor substrate 12, a laminated structure 50a of the first metal film 51, the second metal film 52 and the third metal film 53 is provided only in a range overlapping with the triple contact portion 90. In the plan view of the upper surface 12a along the thickness direction of the semiconductor substrate 12, the laminated structure 50a is provided only within a range of 30 μm from the triple contact portion 90. In a range where the laminated structure 50a is not provided, the surface electrode 50 is constituted of a single metal film 50b made of AlSi. In the plan view of the upper surface 12a along the thickness direction of the semiconductor substrate 12, the laminated structure 50a is provided along the triple contact portion 90. Due to this, in the plan view of the upper surface 12a along the thickness direction of the semiconductor substrate 12, an entirety of the triple contact portion 90 overlaps with the laminated structure 50a.

As described above, the laminated structure 50a of the first metal film 51, the second metal film 52 and the third metal film 53 has high durability against the thermal stress generated at the triple contact portion 90. In the fifth embodiment, since the laminated structure 50a is provided under the triple contact portion 90, the stress generated at the triple contact portion 90 is applied to the laminated structure 50a. Therefore, a crack is suppressed from occurring in the surface electrode 50.

Further, at a position apart from the triple contact portion 90 (especially; in a range apart from the triple contact portion 90 by 30 μm or more), the surface electrode 50 is not constituted of the laminated structure 50a, but is constituted of the metal film 50b. Although durability of the metal film 50b against thermal stress is not so high, thermal stress applied to the metal film 50b is not so high because the metal film 50b is arranged at the position apart from the triple contact portion 90. Therefore, a crack is suppressed from occurring in the metal film 50 b, as well.

Further, in the first embodiment, although the first metal film 51 having flexibility is provided between the second metal film 52 and the semiconductor substrate 12, relatively high thermal stress is applied to the semiconductor substrate 12 because the second metal film 52 having the high tensile strength is provided over the entire region of the surface electrode 50 in the lateral direction. Due to this, a warpage may occur at the semiconductor substrate 12 due to the thermal stress. Contrary to this, in the fifth embodiment, the surface electrode 50 is constituted of the metal film 50b having flexibility (i.e., AlSi), except for the portion right wider the triple contact portion 90. Especially, the surface electrode 50 is constituted of the metal film 50b in an entirety of a range to which thermal stress from the triple contact portion 90 is hardly applied (i.e., the range apart from the triple contact portion 90 by 30 μm or more). Due to this, thermal stress applied to the semiconductor substrate 12 is low, and thus warpage of the semiconductor substrate 12 is suppressed. As such, in the fifth embodiment, the warpage of the semiconductor substrate 12 under a high temperature can be suppressed better than in the first embodiment.

Figure 10:
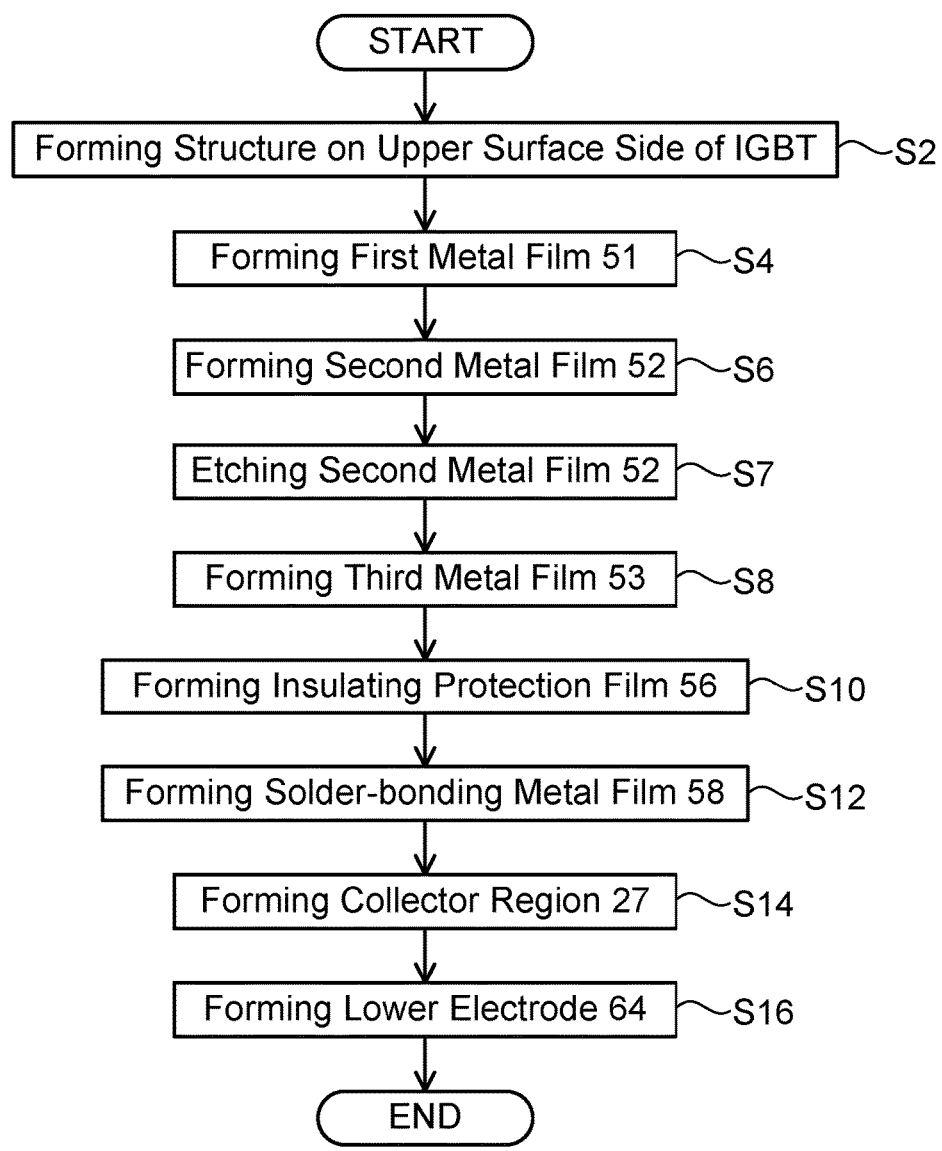
FIG. 10 is a flowchart showing a method of manufacturing the semiconductor device of the fifth embodiment.
Figure 11:
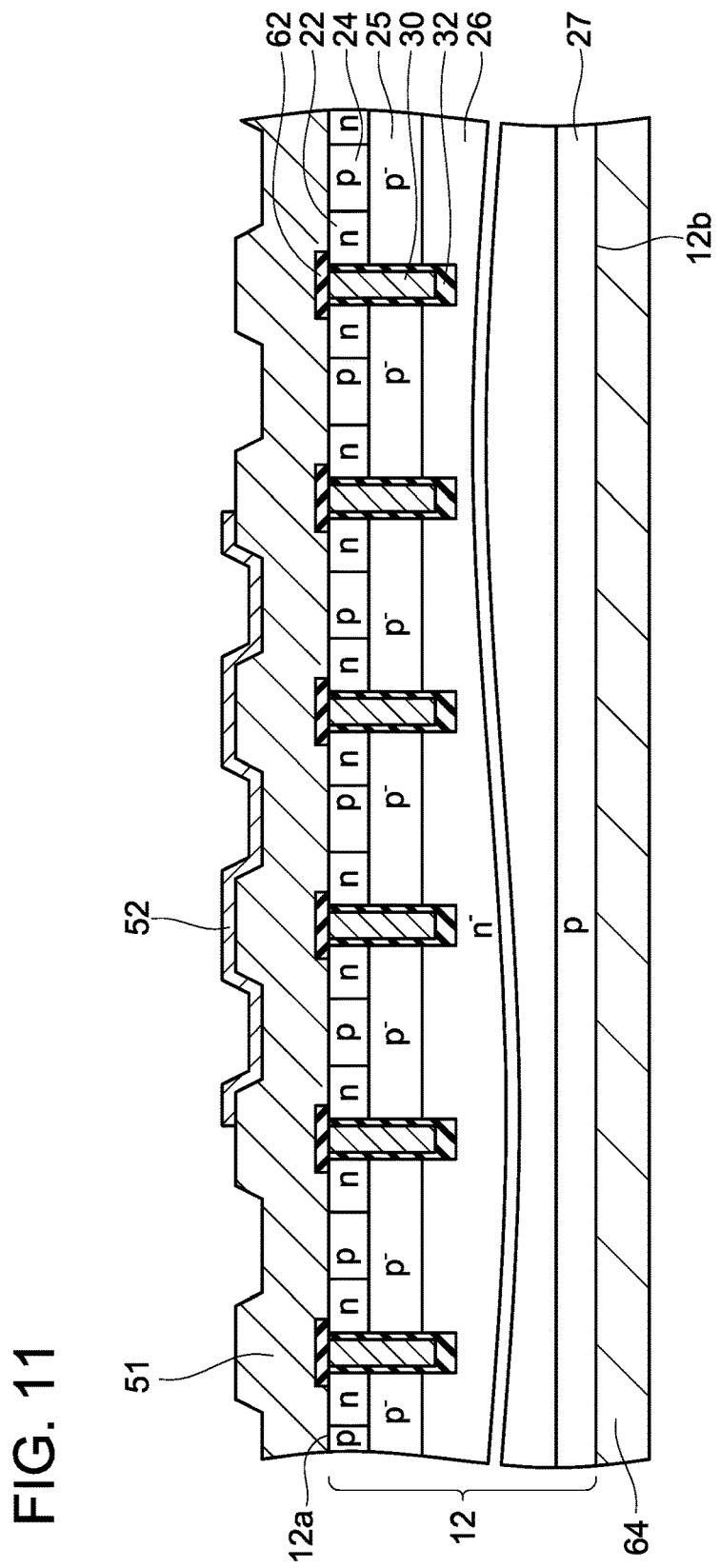
FIG. 11 is a cross-sectional view showing the method of manufacturing the semiconductor device of the fifth embodiment.
Figure 12:
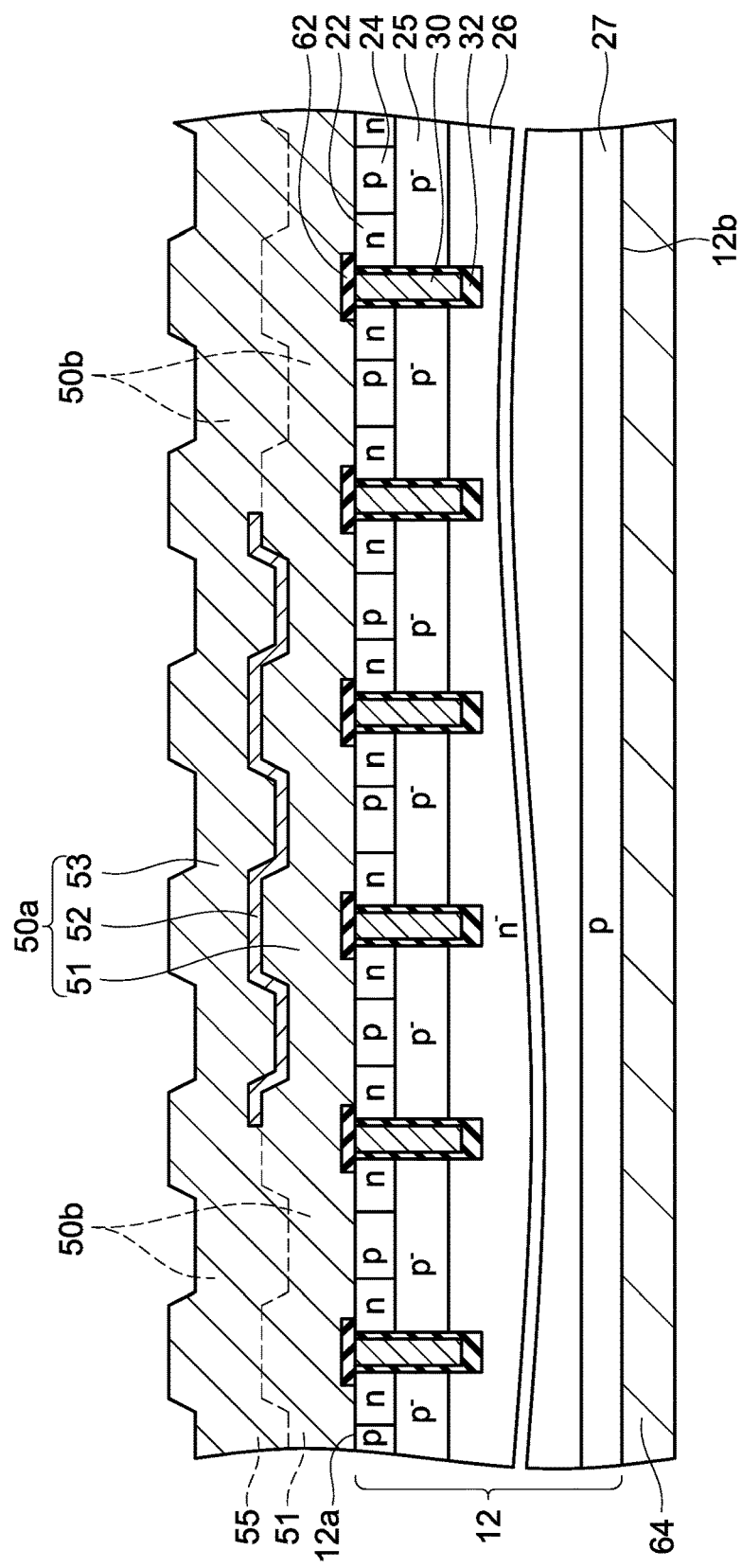
FIG. 12 is the cross-sectional view showing the method of manufacturing the semiconductor device of the fifth embodiment.
Figure 13:
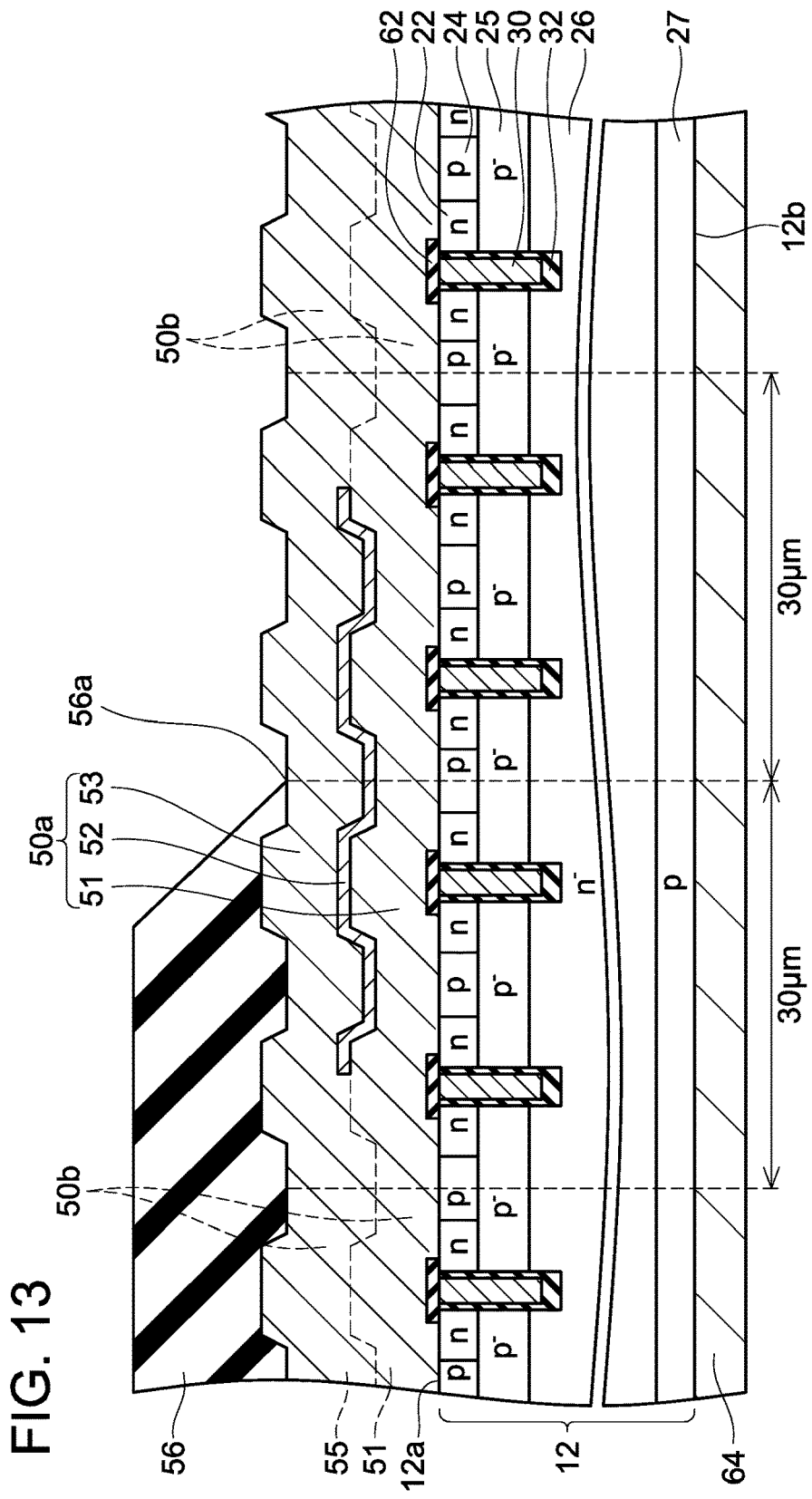
FIG. 13 is the cross-sectional view showing the method of manufacturing the semiconductor device of the fifth embodiment.

FIG. 10 shows a method of manufacturing the semiconductor device of the fifth embodiment. Step S7 is added to the manufacturing method in FIG. 10, as compared to the manufacturing method in FIG. 3. Steps S2 to S6 are performed similarly as in FIG. 3 (i.e., the first embodiment). Next, in step 7, the second metal film 52 is etched. Due to this, as shown in FIG. 11, the second metal film 52 is left on a part of the surface of the first metal film 51, and the second metal film 52 on the other part of the surface of the first metal film 51 is removed. Next, in step S8, an AlSi film 55 is formed to cover a range spreading from the first metal film 51 to the surface of the second metal film 52, as shown in FIG. 12. Similarly to step S8 of the first embodiment, crystal grain size of the AlSi film 55 becomes small on the second metal film 52. The AlSi film 55 grown on the second metal film 52 (the AlSi film with small crystal grain size) constitutes the third metal film 53. The laminated structure 50a is thereby formed. Meanwhile, on the first metal film 51 (i.e., on the first metal film 51 that is not covered by the second metal film 52), the AlSi film 55 is grown to have a substantially same crystal grain size as that of the first metal film 51. That is, the AlSi film 55 on the first metal film 51 becomes a metal film having a larger crystal grain size than the third metal film 53. The first metal film 51 and the AlSi film 55 thereon form the metal film 50b (layer of which entirety in its thickness direction is constituted of AlSi). Next, in step S10, the insulating protection film 56 is formed such that an end portion 56a of the insulating protection film 56 is located on the laminated structure 50a, as shown in FIG. 13. Here, the insulating protection film 56 is formed such that the second metal film 52 is encompassed within a range of 30 μm from the end portion 56a. Thereafter, steps S12 to S16 are performed similarly to the first embodiment to complete the semiconductor device of the fifth embodiment shown in FIG. 9. When the solder-bonding metal film 58 is formed, the end portion 56a shown in FIG. 13 becomes the triple contact portion 90 in FIG. 9. As described above, according to this manufacturing method, the semiconductor device including the laminated structure 50a under the triple contact portion 90 (more specifically, within the range of 30 μm from the triple contact portion 90) can be manufactured.

The second metal film 52 may be constituted of a material different from the material used in the aforementioned embodiments (that is, Ti or TiN). For example, the second metal film 52 may be constituted of at least one of W (tungsten), TiW, Mo (molybdenum), V (vanadium), and the like having a columnar crystal structure similar to Ti and TIN. Even when the second metal film 52 is constituted of such materials, the crystal grain size of the third metal film 53 can be made small in a case of constituting the third metal film 53 with AlSi.

Further, the third metal film 53 may be constituted of a material different from the material used in the aforementioned embodiments (that is, the metal including AlSi as its main material). In this case as well, a crack in the surface electrode 50 can be suppressed by constituting the third metal film 53 with a material having higher tensile strength than the first metal film 51. However, according to the configurations of the aforementioned embodiments, the third metal film 53 with high tensile strength can be formed using AlSi, which is a general material for an electrode of a semiconductor.

Further, the first metal film 51 may be constituted of a material different from the material used in the aforementioned embodiments (that is, the metal including AlSi as its main material). In this case as well, stress applied to the semiconductor substrate 12 can be lessened by constituting the first metal film 51 with a material having lower tensile strength than the third metal film 53. However, according to the configurations of the aforementioned embodiments, the tensile strength of the first metal film 51 can be made lower than the tensile strength of the third metal film 53 while the first metal film 51 and the third metal film 53 are formed by the same metal material. As such, the semiconductor device can easily be manufactured.

Some of the features characteristic to embodiments disclosed herein will be listed. It should be noted that the respective technical elements are independent of one another, and are useful solely or in combinations.

In an example of semiconductor device disclosed herein, a crystal grain size of the third metal film may be smaller than a crystal grain size of the first metal film.

In the third metal film having the small crystal grain size, a crack is less likely to occur, and even if a crack occurs, this crack does not easily grow larger. Thus, according to this configuration, a crack in the surface electrode can more appropriately be suppressed.

In an example of semiconductor device disclosed herein, the third metal film may comprise a main metal layer and metal particles dispersed in the main metal layer.

According to this configuration, the crystal grain size of the main metal layer becomes small, and the tensile strength of the third metal film becomes higher. Thus, according to this configuration, a crack in the surface electrode can more appropriately be suppressed.

In an example of semiconductor device disclosed herein, resistivity of the metal particles may be lower than resistivity of the main metal layer.

According to this configuration, resistance of the third metal film can be reduced.

In an example of semiconductor device disclosed herein, the surface electrode, the insulating protection film, and the solder-bonding metal film may be in contact with each other and may constitute a triple contact portion. In a plan view of the surface of the semiconductor substrate, a laminated structure of the first metal film, the second metal film, and the third metal film may be provided at a part of the surface electrode so as to overlap with the triple contact portion.

By providing the laminated structure within a range overlapping with the triple contact portion as such, the surface electrode can be reinforced in the range overlapping with the triple contact portion. Therefore, a crack can be suppressed from occurring in the surface electrode due to thermal stress generated at the triple contact portion. Further, by providing a range where the laminated structure does not exist (i.e., a range where the second metal film with high tensile strength does not exist) in the surface electrode, the surface electrode can possess flexibility in that range. Due to this, thermal stress applied to the semiconductor substrate due to a difference in linear expansion coefficients of the surface electrode and the semiconductor substrate can be alleviated, and warpage of the semiconductor substrate can be suppressed.

In an example of semiconductor device disclosed herein, in the plan view of the surface of the semiconductor substrate, the laminated structure may be provided within a range of 30 μm from the triple contact portion.

Thermal stress generated at the triple contact portion mainly affects the range of 30 μm from the triple contact portion. Therefore, by providing the laminated structure only within this range, a crack can be suppressed from occurring in the surface electrode due to the thermal stress generated at the triple contact portion. Further, by not providing the laminated structure in the other range, warpage of the semiconductor substrate can be efficiently suppressed.

Further, the disclosure herein provides a method of manufacturing a semiconductor device. A method of manufacturing a semiconductor device disclosed herein may comprise: forming a surface electrode on a surface of a semiconductor substrate; forming an insulating protection film covering a part of a surface of the surface electrode; and forming a solder-bonding metal film, the solder-bonding metal film covering a range spreading from a surface of the insulating protection film to the surface of the surface electrode. The formation of the surface electrode may comprise: forming a first metal film on the semiconductor substrate; forming a second metal film including at least one of Ti, TiN, W, TiW, Mo and V as a main material, and being in contact with a surface of the first metal film; and forming a third metal film including AlSi as a main material, being in contact with a surface of the second metal film, and having a crystal grain size smaller than a crystal grain size of the first metal film.

When at least one of Ti, TiN, W, TiW, Mo, and V is used as the main material of the second metal film, and the third metal film including AlSi as its main material is formed on the surface of the second metal film, the crystal grain size of the third metal film can be made small. Due to this, the tensile strength of the third metal film becomes high, and a crack is less likely to occur in the third metal film. Due to this, a crack in the surface electrode can be suppressed.

In an example of manufacturing method disclosed herein, metal particles may be dispersed in the AlSi in the formation of the third metal film.

According to this configuration, the tensile strength of the third metal film can further be increased.

In an example of manufacturing method disclosed herein, the metal particles may have resistivity lower than resistivity of the AlSi.

According to this configuration, the resistivity of the third metal film can be reduced.

In an example of manufacturing method disclosed herein, the second metal film may be formed on a part of the surface of the first metal film in the formation of the second metal film. The insulating protection film may be formed such that an end portion of the insulating protection film is located above the second metal film in the formation of the insulating protection film.

According to this configuration, the triple contact portion (i.e., the end portion of the insulating protection film) is located above the second metal film. Therefore, by the second metal film and the third metal film provided thereon, a crack can be suppressed from occurring in the surface electrode due to the thermal stress generated at the triple contact portion. Further, according to this manufacturing method, a part of the surface electrode is provided with a range where the second metal film does not exist, and thus the surface electrode can possess flexibility in that range. Due to this, thermal stress applied to the semiconductor substrate due to a difference in linear expansion coefficients of the surface electrode and the semiconductor substrate can be alleviated, and warpage of the semiconductor substrate can be suppressed.

In an example of manufacturing method disclosed herein, the second metal film and the insulating protection film may be formed such that the second metal film is provided within a range of 30 μm from the end portion of the insulating protection film in the plan view of the surface of the semiconductor substrate.

Thermal stress generated at the triple contact portion mainly affects the range of 30 μm from the triple contact portion (i.e., the end of the insulating protection portion). Therefore, by providing the second metal film within this range, a crack can be suppressed from occurring in the surface electrode due to the thermal stress generated at the triple contact portion. Further, by not providing the second metal film in the other range, warpage of the semiconductor substrate can be efficiently suppressed.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device, comprising:
a semiconductor substrate;
a surface electrode covering a surface of the semiconductor substrate;
an insulating protection film covering a part of a surface of the surface electrode; and
a solder-bonding metal film, the solder-bonding metal film covering a range spreading from a surface of the insulating protection film to the surface of the surface electrode, wherein
the surface electrode comprises:
a first metal film provided on the semiconductor substrate;
a second metal film being in contact with a surface of the first metal film, and having tensile strength higher than tensile strength of the first metal film; and
a third metal film being in contact with a surface of the second metal film, and having tensile strength which is lower than the tensile strength of the second metal film and is higher than the tensile strength of the first metal film;
wherein the third metal film comprises a main metal layer and metal particles dispersed in the main metal layer.

2. The semiconductor device of claim 1, wherein resistivity of the metal particles is lower than resistivity of the main metal layer.

3. A semiconductor device, comprising:
a semiconductor substrate;
a surface electrode covering a surface of the semiconductor substrate;
an insulating protection film covering a part of a surface of the surface electrode; and
a solder-bonding metal film, the solder-bonding metal film covering a range spreading from a surface of the insulating protection film to the surface of the surface electrode, wherein
the surface electrode comprises:
a first metal film provided on the semiconductor substrate;
a second metal film being in contact with a surface of the first metal film, and having tensile strength higher than tensile strength of the first metal film; and
a third metal film being in contact with a surface of the second metal film, and having tensile strength which is lower than the tensile strength of the second metal film and is higher than the tensile strength of the first metal film;
wherein:
the surface electrode covers an upper surface of the semiconductor substrate;
the insulating protection film includes a lower surface covering a first part of an upper surface of the surface electrode; and
the solder-bonding metal film covers a range spreading from an upper surface of the insulating protection film to a second part of the upper surface of the surface electrode.

4. The semiconductor device of claim 3, wherein a crystal grain size of the third metal film is smaller than a crystal grain size of the first metal film.

5. The semiconductor device of claim 3, wherein the third metal film comprises a main metal layer and metal particles dispersed in the main metal layer.

6. The semiconductor device of claim 5, wherein resistivity of the metal particles is lower than resistivity of the main metal layer.

7. The semiconductor device of claim 3, wherein
the surface electrode, the insulating protection film, and the solder-bonding metal film are in contact with each other and constitute a triple contact portion, and
in a plan view of the upper surface of the semiconductor substrate, a laminated structure of the first metal film, the second metal film, and the third metal film is provided at a part of the surface electrode so as to overlap with the triple contact portion.

8. The semiconductor device of claim 7, wherein in the plan view of the upper surface of the semiconductor substrate, the laminated structure is provided only within a range of 30 μm from the triple contact portion.

9. The semiconductor device of claim 3, wherein a plurality of trenches are provided on the upper surface of the semiconductor substrate.

10. The semiconductor device of claim 9, wherein each trench is provided with a gate electrode and a gate insulating film.

11. The semiconductor device of claim 10, wherein an upper surface of each gate electrode is covered by an interlayer insulating film.

12. The semiconductor device of claim 11, wherein the semiconductor substrate includes a plurality of N-type emitter regions, p-type body contact regions, p-type body regions, n-type drift regions, and p-type collector regions.

* * * * *